United States Patent
Zhang et al.

(10) Patent No.: US 9,551,749 B2
(45) Date of Patent: Jan. 24, 2017

(54) TEST CIRCUIT FOR VERY LOW VOLTAGE AND BIAS SCAN TESTING OF INTEGRATED CIRCUIT

(71) Applicant: FREESCALE SEMICONDUCTOR, INC., Austin, TX (US)

(72) Inventors: Wanggen Zhang, Suzhou (CN); Huangsheng Ding, Suzhou (CN); Jianzhou Wu, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 32 days.

(21) Appl. No.: 14/743,977

(22) Filed: Jun. 18, 2015

(65) Prior Publication Data
US 2016/0178695 A1 Jun. 23, 2016

(30) Foreign Application Priority Data
Dec. 22, 2014 (CN) .......................... 2014 1 0858263

(51) Int. Cl.
*G01R 31/28* (2006.01)
*G01R 31/3185* (2006.01)
*G01R 31/30* (2006.01)

(52) U.S. Cl.
CPC ............... *G01R 31/318594* (2013.01); *G01R 31/318555* (2013.01); *G01R 31/3004* (2013.01)

(58) Field of Classification Search
CPC ...................... G01R 31/3177; G01R 31/31725
See application file for complete search history.

(56) References Cited

U.S. PATENT DOCUMENTS

| 7,689,897 B2 | 3/2010 | Priel et al. |
| 2003/0084390 A1 | 5/2003 | Tamarapalli et al. |
| 2004/0163021 A1* | 8/2004 | Nadeau-Dostie G01R 31/31858 714/726 |
| 2005/0153465 A1* | 7/2005 | Wada .................. G01R 31/286 438/14 |

(Continued)

FOREIGN PATENT DOCUMENTS

WO 2014068368 5/2014

OTHER PUBLICATIONS

Hong Hao and Edward J. McCluskey; "Very-Low-Voltage Testing for Weak CMOS Logic ICs", International Test Conference 1993; IEEE 0-7803-1429-8/93, 1993.

(Continued)

*Primary Examiner* — April Y Blair
*Assistant Examiner* — Thien D Nguyen
(74) *Attorney, Agent, or Firm* — Charles E. Bergere

(57) ABSTRACT

Test circuitry for an integrated circuit (IC) that has a scan chain includes a control unit for applying a test pattern and a clock signal to the scan chain, and for varying the level of a supply voltage during a scan test procedure. In a first test phase, the supply voltage is set to the rated voltage level of the IC while a test pattern is shifted into the scan chain at a fast rate. A second, capture phase is run at a lower rate and the supply voltage is reduced to a lower level such that defects that cannot be detected when the capture phase is run at the rated voltage are observable yet switching elements in the IC still function correctly. Running the shift phase at the higher speed reduces the overall test time compared with known very low voltage (VLV) scan test procedures.

16 Claims, 3 Drawing Sheets

(56) References Cited

U.S. PATENT DOCUMENTS

2006/0048028 A1* 3/2006 Blasi .............. G01R 31/318569
714/726
2009/0113265 A1 4/2009 Cannon
2009/0164860 A1* 6/2009 Ishimura ........ G01R 31/318575
714/731

OTHER PUBLICATIONS

Praveen Venkataramani and Vishwani D. Agrawal; "Reducing Test Time of Power Constrained Test by Optimal Selection of Supply Voltage", 26th International Conference on VLSI Design and the 12th International Conference on Embedded Systems IEEE 1063-9667/13, 2013.
Ching-Hwa Cheng; "Adaptable Voltage Scan Testing of Charge Sharing Faults for Domino Circuits", Proceedings of the 17th IEEE International Symposium on Defect and Fault Tolerance in VLSI Systems (DFT'02), 2002.

* cited by examiner

TEST CIRCUIT FOR VERY LOW VOLTAGE AND BIAS SCAN TESTING OF INTEGRATED CIRCUIT

BACKGROUND OF THE INVENTION

The present invention relates generally to testing integrated circuit devices and, more particularly, to very low voltage and bias scan testing methods.

Integrated circuit (IC) devices, such as microprocessors or system-on-chip (SOC) devices typically include a complex matrix of logic gates arranged to perform particular functions. These logic gates are often interconnected in two parallel arrangements, one arrangement for operation, and another arrangement for testing. Linking a plurality of flip flops together into a "scan chain" is one known method of arranging logic units for testing. Such a scan chain effectively forms a large shift register that can be used to gain access to internal nodes of the IC device in a test mode of operation. In such a test mode, typically the IC device is powered at its rated voltage level and in a first, scan shift phase, scan test patterns are shifted into scan chains at a pre-chosen clock rate. Then in a second phase, the IC device is put into a normal or 'capture' mode for one or more clock cycles. In a third phase, the IC device is placed in a scan shift mode again and the contents of the scan chain registers (which comprise the test results) are serially shifted out at the same clock rate for comparison with expected output values. This three phase test cycle is typically repeated many times.

It is known that certain manufacturing defects, such as interconnect bridging and gate-oxide shorts, are main causes of early life failures and reliability issues in IC devices. However, these defects often remain undetected by scan tests that are conducted at the normal voltage rating. It is also known that such defects do become evident during scan testing carried out at reduced power supply voltages.

The majority of logic circuits today operate at a power supply voltage of either 1.8 volts or 1.2 volts. However, correct logic operation can be sustained at a much lower voltage. In fact a logic circuit will function correctly, albeit at a reduced speed, as long as the output voltage of a logic gate is sufficient to switch the transistors in the driven gates. Hence, 'very low voltage' or VLV scan testing techniques have been developed that operate at relatively low values of supply voltages, typically at 0.8 volts for example. Normally, the clock rate is also reduced to take into account the longer propagation delays introduced by the use of a reduced supply voltage level. The known VLV scan testing method maintains a constant supply voltage level and a constant clock frequency throughout the scanning and capture phases. Although this method has the advantage of better detection of certain types of faults, a drawback is the reduced running speed of the test and therefore an extended overall test time. For example, a test that is run with reduced supply voltage can take ten times longer than one that is run at the rated voltage level. As product quality requirements increase, test costs become a greater contributor to the total device cost (typically up to 30%). It is desirable to reduce test cost while still keeping test quality at a high level.

Thus it would be advantageous to provide a way of reducing the overall test time of scan testing methods and of VLV scan tests in particular.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
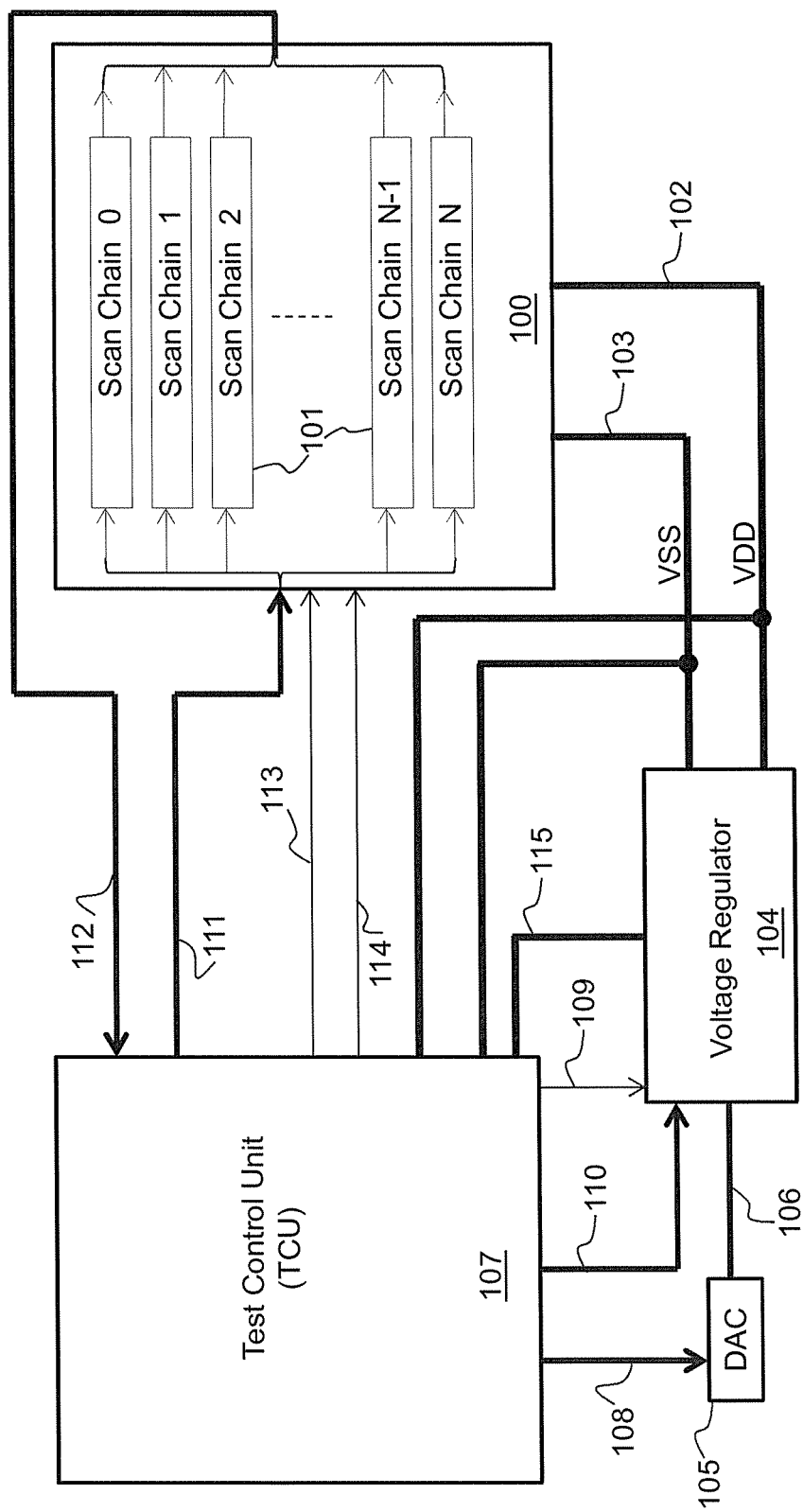
FIG. 1 is a schematic block diagram of test circuitry for an integrated circuit in accordance with an embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides test circuitry for an IC device having at least one scan chain. The test circuitry comprises a control unit operably coupled to the scan chain for applying a test pattern and a clock signal to the scan chain, and a voltage supply module operably coupled to the control unit and to the IC device for applying an operating voltage to the IC device. The control unit is arranged to set, in a scan shift phase, the operating voltage to a first level and a frequency of the clock signal to a first value, and in a scan capture phase, to set the operating voltage to a second level that is different from the first level, and the frequency of the clock signal to a second value.

In another embodiment, the present invention provides a method for testing an integrated circuit that has at least one scan chain for receiving a test pattern and a clock signal. The method comprises: in a scan shift phase, setting an operating voltage of the integrated circuit to a first level and a frequency of the clock signal to a first value, and in a scan capture phase, setting the operating voltage to a second level that is different from the first level, and the frequency of the clock signal to a second value. In one embodiment, the second voltage level is lower than the first voltage level and the second clock frequency value is lower than the first clock frequency value.

It has been observed that the majority of scan test time is spent on the scan shifting process. That is, shifting scan patterns into and out of the scan chain registers. Typically, a shift in or shift out operation can take at least 100 clock cycles, depending on scan chain length. A shifting 'in' phase sets the integrated circuit to a certain state for targeting certain faults. Fault detection proper occurs during the scan capture phase (which normally takes one or two clock cycles). In accordance with one embodiment of the invention, during scan shifting, the normal (rated) voltage is applied so that the major part of the scan test can be run at the normal (fast) speed and during the scan capture phase, the voltage supply is reduced to a lower level or set to bias mode, so that in the capture phase, the targeted fault can be detected.

In an alternative embodiment, the second voltage level is higher than the first voltage level. This alternative embodiment is useful for determining if a previously detected scan failure was only due to a failure of the scan shifting operation as a result of a hold time violation in the latches (or flip flops) comprising the scan chain registers. In one example, the first and second clock frequency values are set so that the capture phase runs at a rated test speed and the scan shift phase runs at a typical scan shift speed. These two clock frequency values may be the same or may be different.

Referring now to FIG. 1, an IC 100 that includes a plurality of scan chains 101 is shown. A scan chain can typically comprise several scan cells. The IC 100 (and the scan chains 101) receive a first supply voltage VDD on line 102 and a second supply voltage VSS on line 103 from a voltage regulator 104. VSS is ground in this embodiment. In one embodiment, the voltage regulator 104 is implemented in the IC 100.

A digital-to-analog converter (DAC) 105 is operably coupled to the voltage regulator 104 and has an output that provides a reference voltage to the voltage regulator on line 106. The DAC 105 is operably coupled to a test control unit (TCU) 107 and receives a control signal from the TCU 107 on line 108. In one embodiment, the DAC 105 is implemented within the TCU 107. In some embodiments, the TCU 107 is implemented in the IC 100. The TCU 107 is also operably coupled to the voltage regulator 104 and provides a 'bias enable' signal on line 109 and a 'low voltage test' enable signal on line 110. The TCU 107 is also operably coupled to the IC 100 and supplies test scan patterns for shifting into the scan chains 101 on line 111 for scan test purposes.

The TCU 107 receives results of scan tests from the IC 100 on line 112. The TCU 107 also supplies a 'scan enable' signal to the IC 100 on line 113 and also supplies a clock signal to the IC 100 on line 114. In one embodiment, the TCU 107 provides a configuration signal on line 115 to the voltage regulator 104. In one embodiment, the clock signal is generated in the TCU 107 and its frequency is set by the TCU 107. In one embodiment the TCU 107 is powered by the voltage regulator 104.

The IC 100 can operate in several modes. One mode is a normal, functional mode of operation whereby the voltage regulator sets the supply voltage VDD on line 102 to the rated voltage for the integrated circuit device 100. Typically, this rated voltage is 1.2 volts.

Another mode is a low voltage scan test mode of operation. In this mode, the TCU 107 asserts a "low voltage test enable" signal on line 110 to the voltage regulator 104 and asserts a control signal to the DAC 108 on line 108. The latter control signal enables the DAC 105 to set a reference voltage for the voltage regulator 104 which overrides the voltage regulator's internal reference voltage which is used in the normal, functional mode.

Figure 2:
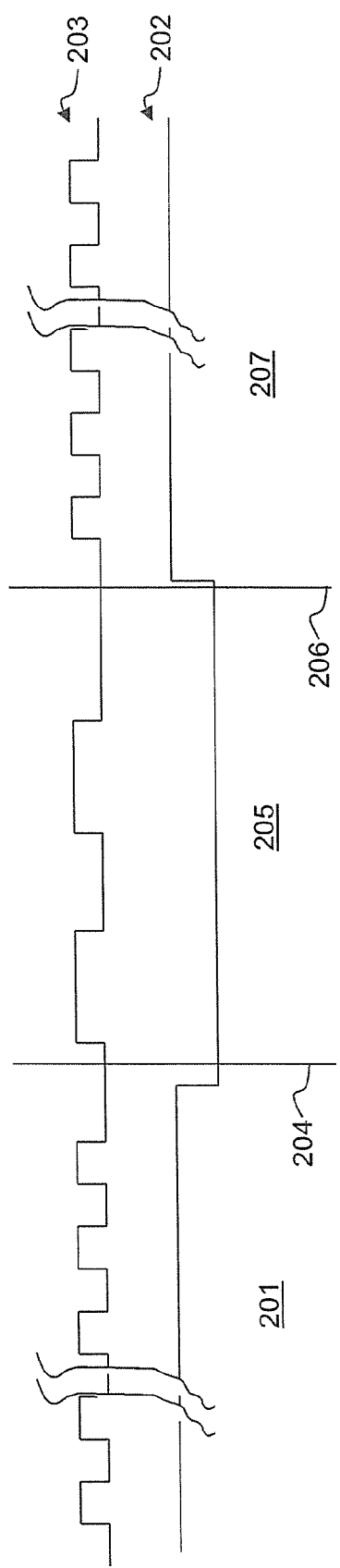
FIG. 2 is a timing diagram illustrating an example of a three-phase test mode of operation for an integrated circuit.

The low voltage scan test mode has three phases. With reference to FIG. 2, a first phase 201 is a scan shift-in phase that is communicated to the IC 100 by the TCU 107 by setting the scan enable signal on line 113 to as logical HIGH value (see trace 202). In this first phase, the TCU 107 also sets the clock signal (trace 203) to a first frequency which the integrated circuit receives on line 114. Also at the commencement of and throughout the first phase 201, the DAC 105 and voltage regulator 104 together ensure that VDD is set to the normal rated voltage level, 1.2 volts, for example. During the first phase 201, a first test pattern, which is stored in the TCU 107 (or alternatively, obtained from external test equipment (not shown), is shifted into the scan chain on line 111. This typically can take many clock cycles depending on the scan chain length.

When all the test data that comprises the test pattern has been received by the scan chains, then the test mode moves to a second phase at point 204 (see FIG. 2). The end of the scan shift-in phase is notified to the IC 100 by the TCU 107 setting the scan enable signal 202 on line 113 to a logical LOW level. A following, second phase is the scan capture phase 205 where the integrated circuit is allowed to react to the input test pattern, either as expected or not, if there is a fault. During the second phase, the TCU 107 sets the frequency of the clock signal 203 to a lower value (compared with the first phase). Also during the second (scan capture) phase, the DAC 105 (under the control of the TCU 107) and the voltage regulator 104 together ensure that VDD is set to a lowered voltage level, (0.8 volts, for example). Hence during the scan capture phase, which runs for typically one or two (reduced) clock cycles, the integrated circuit is powered at a voltage level that is lower than its rated voltage (and low enough to ensure detection of certain faults that are only detectable at the lower levels) but sufficient for normal function. Now, faults of the IC 100, which would not be detectable if the scan capture phase were to be run at the normal voltage level (that is with VDD equal to 1.2 volts in this example), can be detected.

At the end of the scan capture phase 205, at point 206, the TCU 107 sets the scan enable signal 202 back to a logical HIGH value. The third phase is now entered which is another scan shift phase 207. In this third phase 207, the TCU 107 also sets the clock signal (trace 202) back to the first frequency value. Also at the commencement of and throughout this third phase 207, the DAC 105 and voltage regulator 104 together ensure that VDD is set to the normal rated voltage level, 1.2 volts, for example. During the third phase 207, the responses by the IC 100 to the test pattern which was shifted in during the first phase 201 are shifted out into the TCU 107. The received responses comprise the results of the scan test and can be compared with expected values either within the TCU 107 or using other test equipment (not shown) in order to detect any faults.

In another embodiment, during the third phase, while the results of the first test pattern are being shifted out, a second test pattern can be shifted in from the TCU 107.

It will be understood that normally, there exists a settling time during which the voltage level settles to the desired value after switching between scan and capture phases; that is, at points 204 and 206. The voltage supplied to the IC 100 automatically switches to the desired voltage levels for shift and capture respectively on switching between scan phase and capture phase, under the control of the TCU 107. In one embodiment, the DAC output level is directly switched to override the reference voltage of the voltage regulator 104. In this embodiment, the settling time includes both the DAC's settling time and voltage regulator's settling time. In an alternative embodiment, the DAC's output is kept unchanged during the whole test sequence and the voltage supply change is done by changing configuration bits supplied to the voltage regulator 104 on line 115. In this alternative embodiment, only the settling time of the voltage regulator 104 contributes to the voltage settling time.

Low power microcontroller products are currently commercially available. These are capable of operating in a VLPR 'Very Low Power Run' mode, in which VSS (normally grounded) is biased to 0.2V or 0.4V instead of 0V. Also, the run frequency is reduced from typically 80 MHz to 8 MHz or 4 MHz in order to reduce power consumption. Accordingly, it is possible to run such a device in a 'BIAS-SCAN' mode, which corresponds to the VLPR mode in order to test whether the microcontroller (or other similar integrated circuit device) can actually run at the rated VLPR speed of 8 MHz or 4 MHz for example as mentioned above.

Thus, in an example of a bias scan test mode of operation, a bias scan enable signal is asserted to the voltage regulator 104 by the TCU 107 on line 109. In the scan shift phase, VDD is set to 1.2 Volts and VSS is set to zero. The clock frequency is set to the normal scan shift frequency, 20 MHz for example. In the scan capture phase, VDD is kept at 1.2 Volts but VSS is biased to 0.2 Volts so that the operating voltage is reduced compared with the scan shift phase. Also, the clock frequency is set to a lower frequency compared with the scan shift mode, 4 MHz, for example. These test conditions enable it to be determined if the device under test is capable of operating with the rated VLPR speed (4 MHz for example) in the VLPR mode (when VSS is biased).

A first example of a method for scan testing an integrated circuit device in accordance with the invention will now be described with reference to FIG. 1 and. In this example, the operating voltage and clock frequency applied to the integrated circuit are varied during the test procedure as follows. At 301, a test mode is entered and the supply voltage VDD is initially set at the normal, rated level and VSS is grounded. The voltage regulator 104 conditions are set by the TCU 107. In one embodiment, the voltage supply to the integrated circuit device can be automatically switched between the desired voltage levels for scan shift and scan capture. At 302, a scan pattern is loaded into the scan chains 101 under normal supply voltage conditions and at a normal, scan shift speed, that is; at a normal scan clock frequency. (For example, a normal scan shift frequency is typically 20 MHz or 30 MHz for an integrated circuit whose normal operating frequency can be as high as 80 MHz). Also, responses to a previously loaded scan pattern are unloaded, also at the normal scan shift speed. At 303, the level of VDD is reduced on switching to the capture phase and pattern launch and response capture are performed at a reduced speed; i.e., the clock frequency is also reduced. At 304, if it is determined that further tests are to be done, then the process reverts to 302. If all tests are complete, then the process ends at 305.

Figure 3:
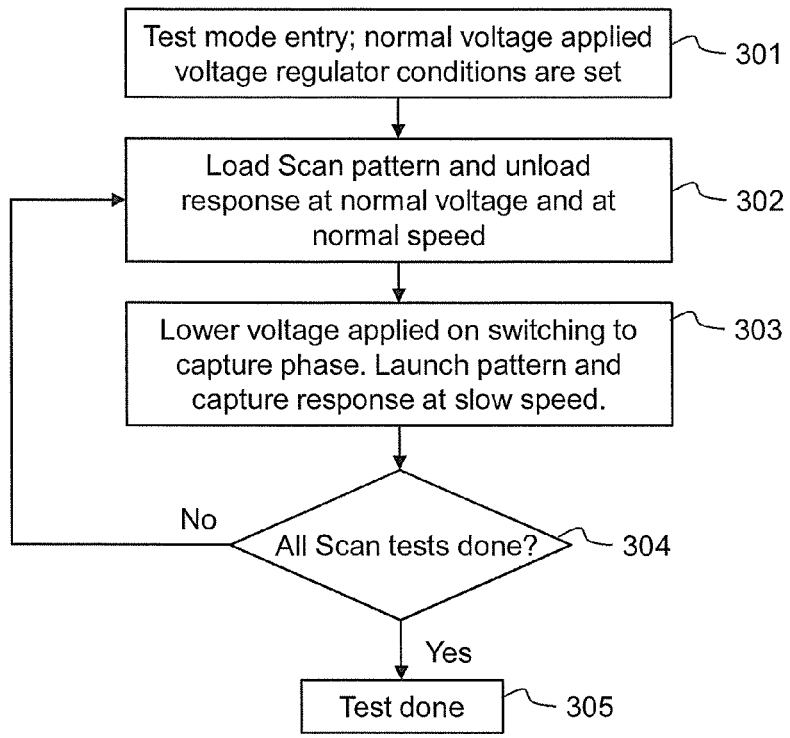
FIG. 3 is a simplified flow chart illustrating first and second methods of testing an integrated circuit in accordance embodiments of the invention.

A second example of a method for scan testing an integrated circuit device in accordance with the invention proceeds as in the first example with reference to FIG. 3 with the exception that on switching to the capture phase, the operating voltage is reduced by biasing the ground reference VSS of the voltage supply by a small positive voltage (while the level of VDD is maintained).

Figure 4:
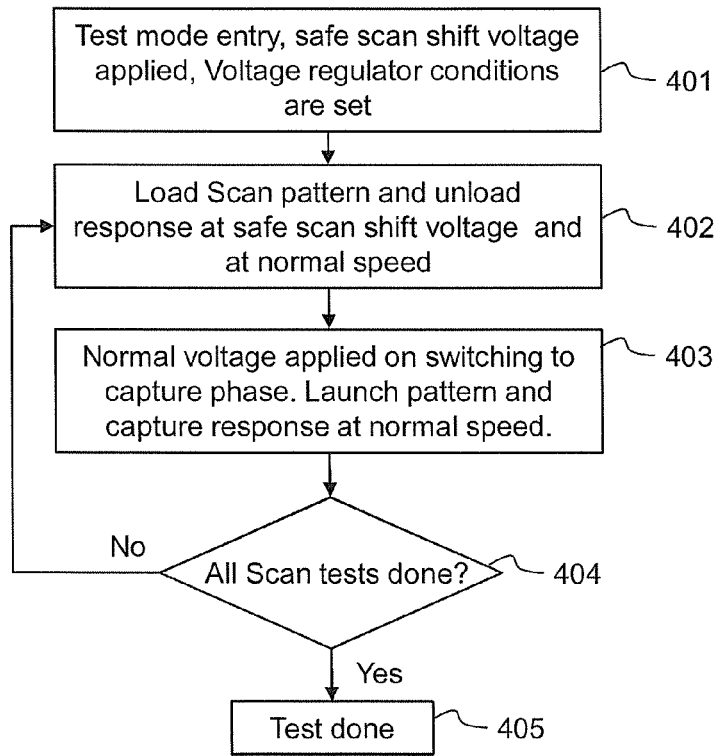
FIG. 4 is a simplified flow chart illustrating a third method of testing an integrated circuit in accordance with an embodiment of the invention.

A third example of a method for scan testing in accordance with an embodiment of the invention will now be described with reference to FIG. 4. This third example comprises a test for scan chain failure diagnosis and recovery. At 401, a test mode is entered and the supply voltage is initially set at a 'safe scan shift' voltage which is lower than the normal rated voltage. This safe scan shift voltage is set at a level where it is expected that a scan shift process will proceed without any hold time violations occurring (i.e., no failure detected would be attributable to a failure of the scan shift process). At 402, a scan pattern is loaded into the scan chains 101 at a normal, scan shift speed but under the lower 'safe scan shift' voltage condition. Also, responses to a previously loaded scan pattern are unloaded, also at the normal, scan shift speed. At 403, the supply voltage is raised to the normal, rated supply voltage on switching to the capture phase and pattern launch and response capture are performed at a normal, capture speed to detect faults at desired conditions (voltage and clock speed) without compromising test quality. At 404, if it is determined that further tests are to be done, then the process reverts to 402. If all tests are complete, then the process ends at 405. A previously detected fault can be identified as having its origin in the scan shift process if the integrated circuit fails a scan test with a normal scan sequence but passes with this scan sequence 401-495. The yield lost due to a scan shift failure (due to a timing problem on a scan path) can be safely recovered using the scan test method herein described with reference to FIG. 4. The safe scan shift voltage can be found by testing scan chain patterns at different voltage levels until the desired result is obtained. In one example, a value for the first voltage level is determined by running multiple scan chain tests at different voltages until no scan shift failures are detected. The voltage level at which this non-failure condition occurs is a safe scan shift voltage level.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

A signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signal.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. Test circuitry for an integrated circuit (IC) device having at least one scan chain, the test circuitry comprising:
   a control unit operably coupled to the at least one scan chain for applying a test pattern and a clock signal to the at least one scan chain; and
   a voltage supply module operably coupled to the control unit and the IC device for applying an operating voltage to the IC device based on a supply voltage and a ground reference provided by the voltage supply module,
   wherein the control unit sets, in a scan shift phase, the operating voltage of the IC device to a first voltage level and a frequency of the clock signal to a first frequency value, and in a scan capture phase, the control unit sets the operating voltage of the IC device to a second voltage level that is less than the first voltage level by positively biasing the ground reference of the voltage supply module, and the frequency of the clock signal to a second frequency value, such that the IC device is powered at the second voltage level in the scan capture phase.

2. The test circuitry of claim 1, wherein the second voltage level is lower than the first voltage level and the second clock frequency value is lower than the first clock frequency value.

3. The test circuitry of claim 1, wherein the second voltage level is higher than the first voltage level.

4. The test circuitry of claim 3, wherein the control unit controls the voltage supply module to set the first voltage level to a voltage level equal to a rated voltage of the IC device.

5. The test circuitry of claim 3, wherein the control unit controls the voltage supply module to set the second voltage level to a voltage level equal to a rated voltage of the IC device.

6. A method for testing an integrated circuit (IC) comprising at least one scan chain for receiving a test pattern and a clock signal, the method comprising:
   in a scan shift phase, setting an operating voltage of the IC to a first voltage level by providing a supply voltage and a ground reference to the IC and a frequency of the clock signal to a first frequency value; and
   in a scan capture phase, setting the operating voltage of the IC to a second voltage level that is different from the first voltage level by biasing the ground reference, and the frequency of the clock signal to a second frequency value, such that the IC is powered at the second voltage level in the scan capture phase.

7. The method of claim 6, further comprising setting the second voltage level to a level that is lower than the first voltage level and setting the second clock frequency value to a value that is lower than the first clock frequency value.

8. The method of claim 7, further comprising setting the first voltage level to a level equal to a rated voltage of the IC.

9. The method of claim 6, further comprising setting the second voltage level to a level that is higher than the first voltage level.

10. The method of claim 9, further comprising setting the second voltage level to a level equal to a rated voltage of the IC.

11. The method of claim 9, further comprising determining a value for the first voltage level by running multiple scan chain tests at different voltages until no scan shift failures are detected.

12. The method of claim 6, further comprising:
   in a first scan shift phase, shifting a first test pattern into the scan chain, and
   in a second scan shift phase following the scan capture phase, shifting a response to the first test pattern out of the scan chain,
   wherein during both the first and second scan shift phases, the operating voltage of the IC is set to the first voltage level and the frequency of the clock signal is set to the first frequency value.

13. The method of claim 12, wherein during the second scan shift phase, a second test pattern is scanned into the scan chain.

14. An integrated circuit (IC) device, comprising:
   at least one scan chain;
   a test control unit operably coupled to the scan chain for applying a test pattern and a clock signal to the scan chain; and
   a voltage supply module operably coupled to the test control unit for applying an operating voltage to the scan chain based on a supply voltage and a ground reference provided by the voltage supply module,
   wherein the test control unit is arranged to set, in a scan shift phase, the operating voltage of the IC device to a first voltage level and a frequency of the clock signal to a first frequency value, and in a scan capture phase, to set the operating voltage of the IC device to a second voltage level that is different from the first voltage level by biasing the round reference of the voltage supply module, and the frequency of the clock signal to a second frequency value, such that the IC device is powered at the second voltage level in the scan capture phase.

15. The test circuitry of claim 1, wherein the voltage supply module comprises a digital-to-analog converter and a voltage regulator coupled to the digital-to-analog converter, wherein the control unit sets the operating voltage by controlling at least one of the digital-to-analog converter and the voltage regulator.

16. The test circuitry of claim 15, wherein the control unit sets the operating voltage by controlling the digital-to-analog converter.

* * * * *